(12) United States Patent
Chen

(10) Patent No.: US 7,145,783 B2
(45) Date of Patent: Dec. 5, 2006

(54) APPARATUS REDUCING RADIATED EMISSION FROM ELECTRONIC MODULES

(75) Inventor: Chingchi Chen, Ann Arbor, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 369 days.

(21) Appl. No.: 10/709,930

(22) Filed: Jun. 7, 2004

(65) Prior Publication Data

US 2005/0270115 A1     Dec. 8, 2005

(51) Int. Cl.
*H05K 9/00*     (2006.01)
(52) U.S. Cl. ..................................... 361/818
(58) Field of Classification Search .............. 307/10.1; 340/472; 361/816, 818, 800; 174/350
See application file for complete search history.

(56) References Cited

U.S. PATENT DOCUMENTS

| | | | |
|---|---|---|---|
| 4,519,664 A | 5/1985 | Tillotson |
| 5,303,411 A | 4/1994 | Stengel et al. |
| 5,304,964 A | 4/1994 | DiMarco |
| 5,331,505 A | 7/1994 | Wilheim |
| 5,463,294 A | 10/1995 | Valdivia et al. |
| 5,569,966 A | 10/1996 | Schantz, Jr. et al. |
| 5,703,411 A | 12/1997 | Bella et al. |
| 5,789,797 A | 8/1998 | Ikuta et al. |
| 5,982,253 A | 11/1999 | Perrin et al. |
| 6,007,351 A | 12/1999 | Gabrisko, Jr. et al. |
| 6,274,951 B1 | 8/2001 | Saikalis et al. |
| 6,410,983 B1 | 6/2002 | Moriizumi et al. |
| 6,413,119 B1 | 7/2002 | Gabrisko, Jr. et al. |
| 6,819,572 B1* | 11/2004 | Schaffer ..................... 361/818 |
| 7,046,982 B1* | 5/2006 | Asano et al. ............... 455/349 |

FOREIGN PATENT DOCUMENTS

| | | |
|---|---|---|
| CN | 1290987 | 4/2001 |
| DE | 3406671 | 8/1985 |
| JP | 2002090243 | 3/2002 |
| JP | 2003110367 | 4/2003 |

* cited by examiner

*Primary Examiner*—Hung V. Ngo
(74) *Attorney, Agent, or Firm*—David B. Kelley; Brooks & Kushman

(57) ABSTRACT

The present invention provides an electronic module assembly with reduced EMI noise emission. The electronic module assembly of the invention includes an electronic module component that emits EMI noise. The electronic module assembly has a first electric reference region and a second electric reference region that is in communication with electronic module component. An impedance component is positioned in series with the first reference region and the second reference region such that impedance component attenuates the first electromagnetic noise signal. The electronic module assembly further includes low pass filter component that is in electrical communication with electronic module component. The present invention also provides a method of reducing EMI noise emission.

23 Claims, 4 Drawing Sheets

APPARATUS REDUCING RADIATED EMISSION FROM ELECTRONIC MODULES

BACKGROUND OF INVENTION

1. Field of the Invention

The present invention is related to an apparatus and a method of reducing electromagnetic noise on the input and outputs of an electronic component; and in particular, to an apparatus and a method of reducing electromagnetic noise on the input and output of an electronic component contained in an automobile.

2. Background Art

The inclusion of electronic components in motor vehicles tracks the development and improvement of such devices. Since the development of the first automobiles, there has been a continuing trend to replace mechanical devices with electronic devices which operate in a more sophisticated manner. Such devices include, for example, braking systems, engine control microprocessors, and the like. Moreover, new technologies have been integrated into automobiles as such technologies have become available. Examples of such technologies include entertainments systems (radio, CD players), communication systems (cell phones), navigation systems, environmental control systems, and the like.

Electronic components are potential noise sources if onboard devices are performing high-speed switching. Similarly, nearby sources pass noise to the electronic components through input/output ports, which disturb the component. Moreover, part of the undesired energy may be re-distributed to other ports of the electronic components. Hybrid electric vehicles (HEVs) and electric vehicles, in particular, are replete with electronic devices and components. Such components include both sophisticated integrated circuit based devices and well a relatively large passive-component based system. In addition to the components which may be found in an internal combustion vehicle, HEVs typically include a high voltage battery which is used to operate a motor/generator assembly which provides torque to the wheels of the vehicle. Operation of an HEV or an electric vehicle requires conditioning of the electrical signal between the high voltage battery and the electric motor to provide compatibility between the inputs and outputs of the various components within the HEV. Such conditioning components include, for example, converters, inverters, rectifiers, and frequency changers. Inverters are used to converts DC voltages to AC voltages, rectifiers convert AC voltages to DC voltages, and frequency changers matches the input AC power to the required AC output.

To stop noise propagation, filters are implemented near the input/output ports of electronic components in order to attenuate electromagnetic noise of the components inputs or outputs. Such filters normally have low-pass characteristics with shunt capacitors between signal traces and a reference plane (normally it's the ground plane). Unfortunately, in many cases the reference planes are noisy thereby cause the noise to find a path from the noisy reference plane through the shunt capacitors to the signal lines. In other words, these shunt capacitors may introduce more noise to the signal lines than initially present. To address this problem, the reference plane noise level must be reduced which is not easy or nearly impossible. Another approach is to identify a quiet area as a new reference plane. To keep this new zone quiet, major noise currents must be isolated from this area with enough isolation between this area and the noisy regions to produce acceptable levels of noise on the signal lines.

Accordingly, there exists a need for improved strategies for reducing the affect of electromagnetic interference on the electronic components of a vehicle and in particular on the electronic components of a hybrid electric vehicle.

SUMMARY OF INVENTION

The present invention overcomes one or more problems of the prior art by providing in one embodiment an electronic module electromagnetic interference ("EMI") noise emission. Accordingly, the assembly of the invention will emit less noise that disturbs other components. The electronic module assembly of the invention includes an electronic module component that emits EMI noise. This electronic module component itself may include a number of passive and active components such as integrated circuits, diodes, transistors, resistors, capacitors, inductors, and the like. The electronic module assembly has a first electric reference region that is in communication with electronic module component. The first electric reference region is contaminated with a first electromagnetic noise signal which at least in part causes unacceptably high noise on the input and outputs of the electronic module component. Advantageously, a second electric reference region can be identified or designed into the electronic module component. This second electric reference region is characterized by a second electromagnetic noise signal which will have a lower magnitude than the first electromagnetic noise signal because of the design of the present invention. Specifically, an impedance component is position in series with the first reference region and the second reference region such that impedance component attenuates the first electromagnetic noise signal. The electronic module assembly further includes filter component that is in electrical communication with electronic module component. The filter component reduces the noise on the inputs and/or outputs to the electronic module component. It has been found that the use of the impedance component which provides a quieter second reference region allow for a simple yet efficient reduction in the noise afflicting electronic components, especially, in such components used in an automobile. Two variation of the electronic component assembly of the invention have been found to be useful. In one variation, the filter component and the electronic module assembly resides on a single circuit board. In the second variation, the filter component and the electronic module component reside on separate circuit boards.

In another embodiment of the present invention, a method of reducing EMI noise emission from input and output signals of an electronic module utilizing the electronic module assembly of the invention is provided. The method of the invention comprises reducing EMI noise emission from the inputs or outputs of an electronic component module by positioning an impedance component in series with a first electric reference region and a second electric reference region. As set forth above, second electric reference region is characterized by a second electromagnetic noise signal that is less than the first electromagnetic noise signal which characterizes the first electric reference region. Next, one or both of an output signal and an input signal to the electronic module component are filtered with filter component referenced to second (quieter) electric reference region.

DETAILED DESCRIPTION

Reference will now be made in detail to presently preferred compositions or embodiments and methods of the invention, which constitute the best modes of practicing the invention presently known to the inventor.

Figure 1:
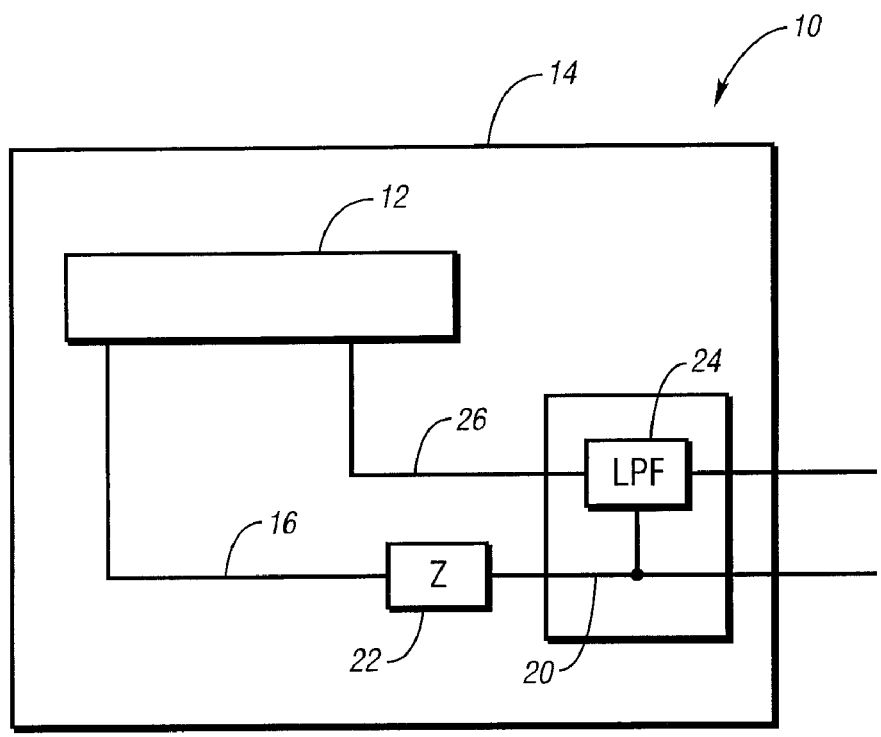
FIG. 1 is a schematic of the electronic module assembly of the present invention where the electronic module component and the low pass filter component reside on the circuit board.

In an embodiment of the present invention, an electronic module assembly with reduced EMI noise emission is provided. With reference to FIG. 1, a schematic of the electronic module assembly of the present invention is shown. Electronic module assembly 10 includes electronic module components 12 which emits EMI noise. Typically component 12 will reside on carrier 14 which is a circuit board. Assembly 10 also has a first electric reference region 16 that is in communication with electronic component 12. In communication as used herein means in electrical contact albeit such electrical contact may have one or more additional electronic components interposed. First electric reference region 16 is characterized by a first electromagnetic noise signal which contaminates input or output signals from electronic module component 12. Moreover, assembly 10 also includes second electric reference region 20 which is characterized by a second electromagnetic noise signal. Impedance component 22 is position in series with the first reference region and the second reference region such that impedance component attenuates the first electromagnetic noise signal such that the second electromagnetic noise signal has a magnitude that is less than the magnitude of the first electromagnetic noise signal. Finally, assembly 10 further includes low pass filter component 24 which is in electrical communication with electronic module 12. Low pass filter component 24 is referenced to second electric reference region 20 which is now quieter (i.e., less noisy) than first electric reference region 16. Low pass filter component 24 attenuates electromagnetic noise on signal line 26 of electronic module 12. Signal line 26 may carry either input or output signals.

Low pass filter component 24 may be an active or passive low pass filter. Examples of suitable filter components include a shunt capacitor with a first terminal in electrical contact with second reference region 20 and a second terminal in electrical communication with the input or output signals of the electronic component. Another example of a suitable configuration for low pass filter component 24 is common mode inductors with a shunt capacitor between each input to the differential reference pair. The low pass filter component 24 may be characterized by a time response by method known to those skilled in the art of filter design. The optimal time response will be selected base on the frequency of the electromagnetic noise signal which is to be filtered. For a first electromagnetic noise signal has a frequency from about 0.1 to about 100 KHz a suitable time response will be from about 0.01 milliseconds to about 10 milliseconds. When the first electromagnetic noise signal has a frequency from about 0.1 MHz to about 100 MHz a suitable time response will be from about 0.01 microseconds to about 10 microseconds.

As set forth above, impedance component 22 is position in series with first reference region 16 and second reference region 20 such that the first electromagnetic noise signal is attenuated such that the second electromagnetic noise signal has a magnitude that is less than the magnitude of the first electromagnetic noise signal. The magnitude of the impedance of impedance component 22 is preferably from about 1 ohm to about 500 ohms. More preferably, the magnitude of the impedance of component 22 is from about 2 ohms to about 200 ohms; and most preferably, the magnitude of the impedance of impedance component 22 is from about 5 ohms to about 50 ohms.

Figure 2:
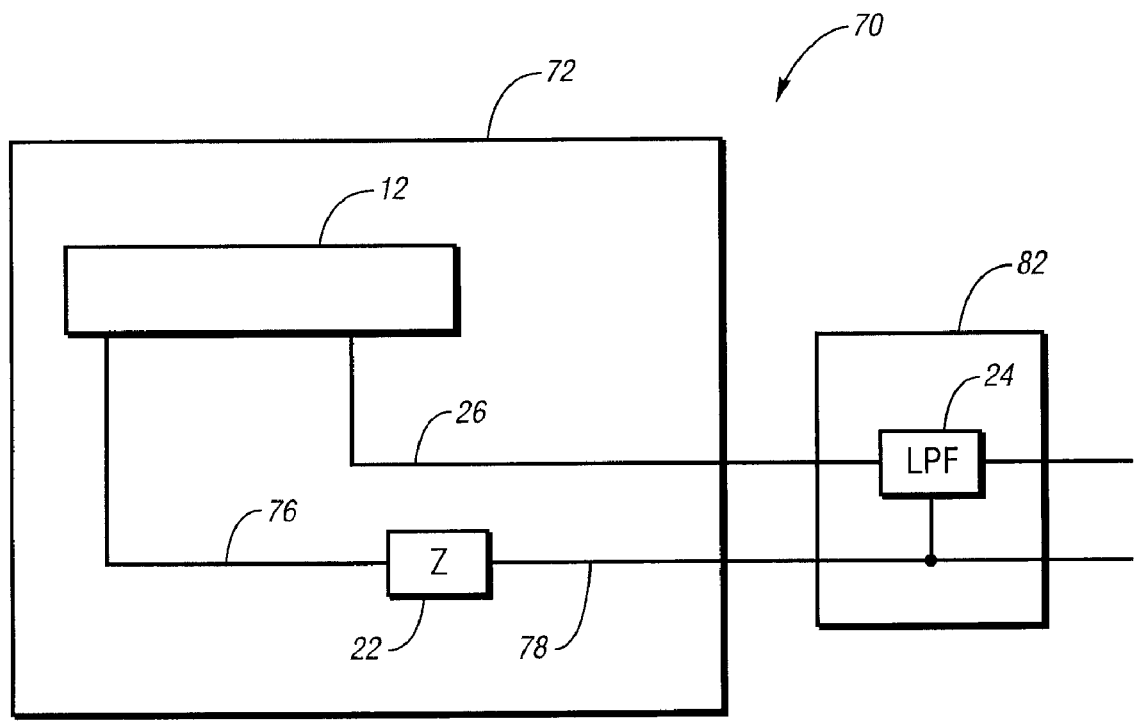
FIG. 2 is a schematic of the electronic module assembly of the present invention where the electronic module component and the low pass filter component reside on different circuit boards.

In a first variation of the present invention, low pass filter component 24 and electronic module component 12 reside on the same circuit board. FIG. 1 provides a schematic of this first variation. In a second variation of the invention, low pass filter component 24 and electronic module reside 12 reside on the different circuit boards. With reference to FIG. 2, electronic module assembly 70 includes a first circuit board 72 with electronic module component 12 susceptible to interference by electromagnetic noise mounted thereon. First electric reference region 76 is in communication with electronic module component 12. First electric reference region 76 is characterized by a first electromagnetic noise signal. Second electric reference region 78 is characterized by a second electromagnetic noise signal. Impedance component 22 is in series with the first reference region 76 and second reference region 78 such that impedance component 22 attenuates the first electromagnetic noise signal so that second electric reference region 78 is characterized by a second electromagnetic noise signal wherein the magnitude of the second electromagnetic noise signal is less than the magnitude of the first electromagnetic noise signal. Electronic module assembly 70 further includes second circuit board 82 with low pass filter component 24 residing thereon. Low pass filter component 24 is in communication with electronic module component 12 and referenced to the second electric reference region 78. Low pass filter component 24 attenuates electromagnetic noise on one or both of input signals to the electronic module component 12 or output signals from electronic module component 12. Selections for electronic component 12, impedance component 22, and low pass filter component 24 are the same as those set forth above.

Figure 3A:
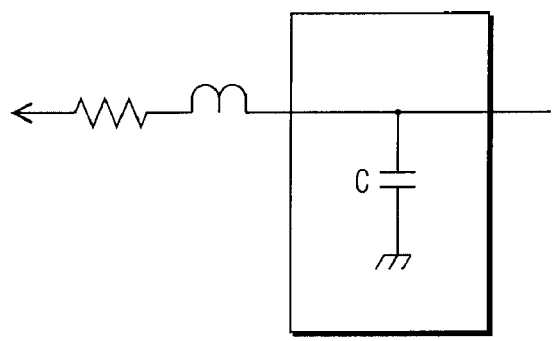
FIG. 3A is a schematic of a simply low pass filter component which includes only a capacitor operating in conjunction with any stray resistance or inductance in the electronic module assembly of the present invention.
Figure 3D:
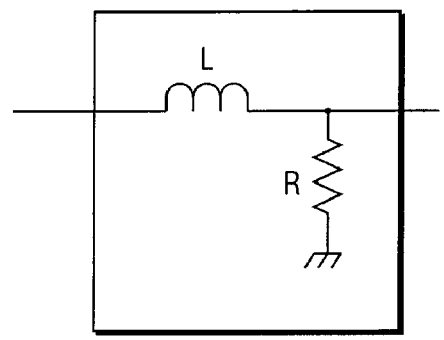
FIG. 3D is a schematic of a low pass L-R filter that can be used as the low pass filter component in practicing the present invention.
Figure 3B:
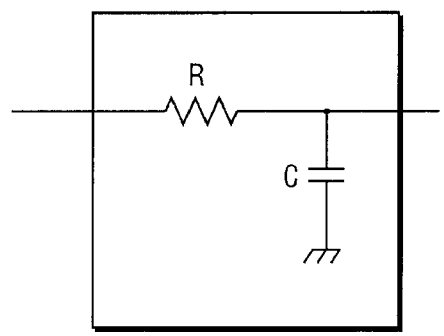
FIG. 3B is a schematic of a low pass R-C filter that can be used as the low pass filter component in practicing the present invention.
Figure 3E:
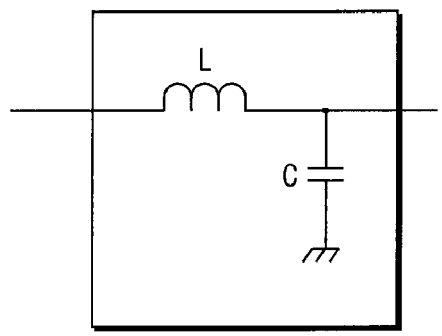
FIG. 3E is a schematic of a low pass L-C filter that can be used as the low pass filter component in practicing the present invention.
Figure 3C:
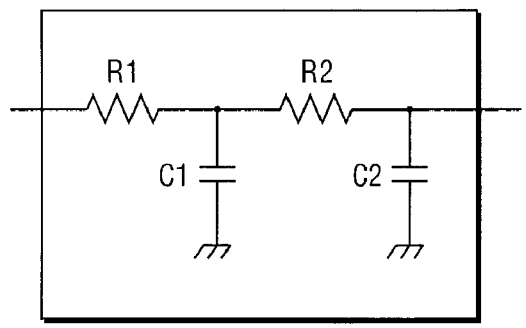
FIG. 3C is a schematic of a two stage low pass R-C filter that can be used as the low pass filter component in practicing the present invention.
Figure 3F:
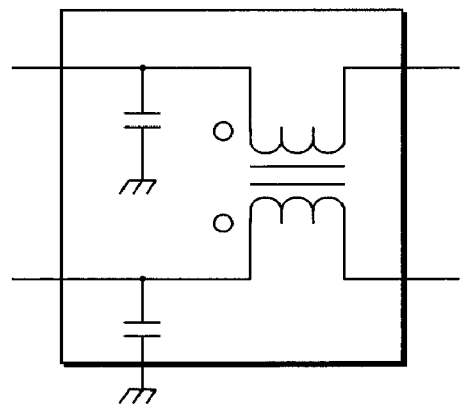
FIG. 3F is a schematic of a low pass filter component that includes common mode inductors with a shunt capacitor between each input to the differential reference pair.

With reference to FIGS. 3A–F, non-limiting examples of low pass filter configurations which may be used in the practice of the present invention are provided. FIG. 3A is a schematic of a simple low pass filter component which includes only a capacitor operating in conjunction with any stray resistance or inductance. FIG. 3B is a schematic of a low pass R-C filter that can be used as the low pass filter component in practicing the present invention. FIG. 3C is a schematic of a two stage low pass R-C filter that can be used as the low pass filter component in practicing the present invention. FIG. 3D is a schematic of a low pass L-R filter that can be used as the low pass filter component in practicing the present invention. FIG. 3E is a schematic of a low pass L-C filter that can be used as the low pass filter component in practicing the present invention. FIG. 3F is a schematic of a low pass filter component that includes common mode inductors with a shunt capacitor between each input to the differential reference pair.

In another embodiment of the present invention, a method of reducing noise on the input and output signals of an electronic module is provided. The presence of such noise may lead to EMI noise emission that can interfere with other electronic components. With reference to FIG. 1, the electromagnetic noise appearing on the inputs or outputs to electronic component module 12 is reduced by positioning impedance component 22 in series with first electric reference region 16 and second electric reference region 20. As set forth above, second electric reference region 20 is characterized by a second electromagnetic noise signal that is less than the first electromagnetic noise signal because of attenuation of the first electromagnetic noise signal by impedance component 22. Next, one or both of an output signal and an input signal to the electronic module component 12 are filtered with low pass filter component 22 referenced to second electric reference region 20. Second electric reference region 20 provides a quieter reference than the noisier first electric reference region 16 because of the action of impedance component 22. The method of this embodiment may be applied in either variation in which electronic module component 12 and low pass filter component 24 reside on the same or different circuit boards. Selections for electronic component 12, impedance component 22, and low pass filter component 24 are the same as those set forth above for the electronic module assembly.

Figure 4A:
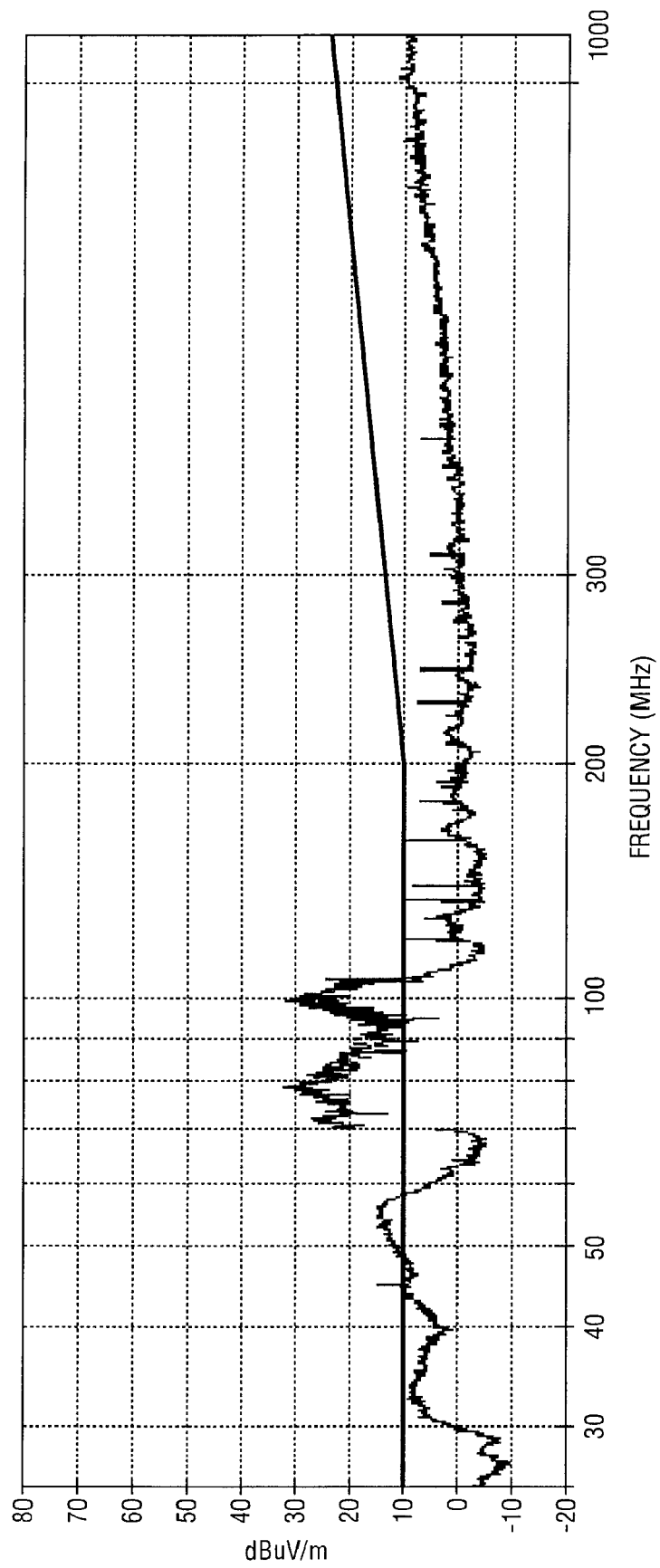
FIG. 4A is a plot of the noise spectrum of a component without the filtering of the present invention.
Figure 4B:
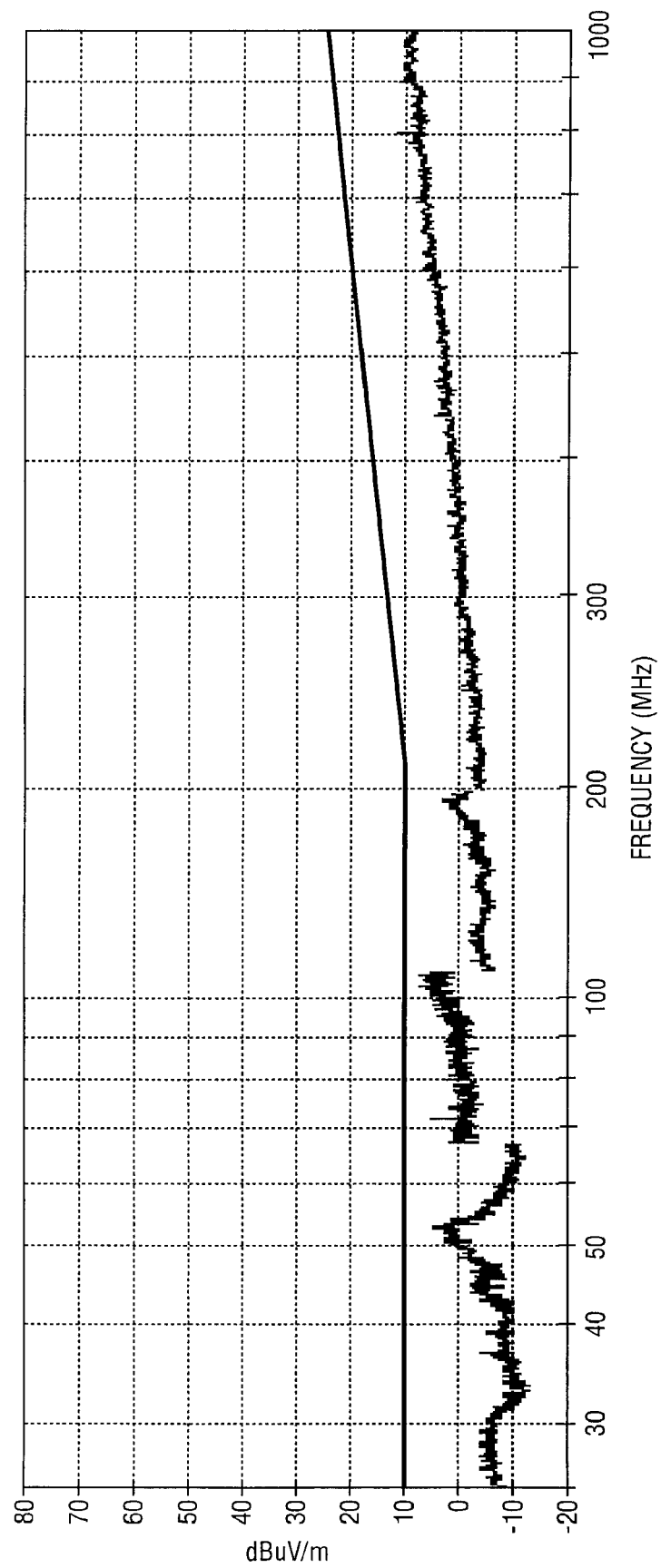
FIG. 4B is a plot of the noise spectrum of a component with the filtering of the present invention

The advantages of the electronic module and electromagnetic noise filter method of the present may be appreciated by reference to FIGS. 4A–B. FIG. 4A provides an electromagnetic noise spectrum for an electronic device without filtering while FIG. 4B provides an electromagnetic noise spectrum for an electronic component with the filtering method of the present invention. The radiated EMI noise from electronic device is measured by operating the device and measuring the signal received by an antenna with a spectrum analyzer. The radiated EMI is measured from 25 mega Hertz (MHz) to 1000 MHz, with the instrument's resolution bandwidth ("RBW") set to 9 kiloHertz (KHz). However, at the FM radio frequency band, (roughly between 70 MHz and 108 MHz), the RBW is changed to 120 KHz to reflect the receiving bandwidth of a regular FM radio. However, when the RBW is increased, the energy received by the instrument is also increased (even the actual noise is the same). This explains the jumps at 70 MHz and 108 MHz on the spectrum shown in FIGS. 4A and 4B. FIG. 4B clearly shows a significant drop in the magnitude of the noise for all frequencies as compared to FIG. 4A.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

The invention claimed is:

1. An electronic module assembly with reduced EMI noise emission from an electronic module component that emits EMI noise, the assembly comprising:
a first electric reference region in communication with the electronic component, the first electric reference region being characterized by a first electromagnetic noise signal;
a second electric reference region characterized by a second electromagnetic noise signal;
an impedance component in series with the first reference region and the second reference region such that the impedance component attenuates the first electromagnetic noise signal such that the magnitude of the second electromagnetic noise signal is less than the magnitude of the first electromagnetic noise signal; and
a low pass filter component in communication with the electronic module and referenced to the second electric reference region, the low pass filter component attenuating electromagnetic noise on one or both of input signals to the electronic module component or output signals from the electronic module component.

2. The electronic module assembly of claim 1 wherein the low pass filter component is an active or passive low pass filter.

3. The electronic module assembly of claim 2 wherein the low pass filter component has a time response from about 0.01 milliseconds to about 10 milliseconds when the first electromagnetic noise signal has a frequency from about 0.1 to about 100 KHz.

4. The electronic module assembly of claim 3 wherein the low pass filter component has a time response from about 0.01 microseconds to about 10 microseconds when the first electromagnetic noise signal has a frequency from about 0.1 MHz to about 100 MHz.

5. The electronic module assembly of claim 1 wherein the low pass filter component is a shunt capacitor with a first terminal in electrical contact with the second reference region and a second terminal in electrical communication with the input or output signals of the electronic component.

6. The electronic module assembly of claim 1 wherein the low pass filter component comprises common mode inductors with a shunt capacitor between each input to the common mode inductors.

7. The electronic module assembly of claim 1 wherein the low pass filter component and the electronic module component reside on the same circuit board.

8. The electronic module assembly of claim 1 wherein the low pass filter component and the electronic module component reside on separate circuit boards.

9. The electronic module assembly of claim 1 wherein the magnitude of the impedance of the impedance component is from about 1 ohm to about 500 ohms.

10. The electronic module assembly of claim 9 wherein the magnitude of the impedance of the impedance component is from about 2 ohms to about 200 ohms.

11. The electronic module assembly of claim 10 wherein the magnitude of the impedance of the impedance component is from about 5 ohms to about 50 ohms.

12. An electronic module assembly with reduced EMI noise emission, the assembly comprising:
a first circuit board;
an electronic module component that emits EMI noise;
a first electric reference region in communication with the electronic component, the first electric reference region being characterized by a first electromagnetic noise signal;
a second electric reference region characterized by a second electromagnetic noise signal;
an impedance component in series with the first reference region and the second reference region such that the impedance component attenuates the first electromagnetic noise signal so that the second electric reference region is characterized by a second electromagnetic noise signal wherein the magnitude of the second electromagnetic noise signal is less than the magnitude of the first electromagnetic noise signal;
a second circuit board; and
a low pass filter component residing on the second circuit board in communication with the electronic module and referenced to the second electric reference region, the low pass filter component attenuates electromagnetic noise on one or both of input signals to the electronic component or output signals from the electronic module.

13. The electronic module assembly of claim 12 wherein the low pass filter component is an active or passive low pass filter.

14. The electronic module assembly of claim 12 wherein the low pass filter component is a shunt capacitor with a first terminal in electrical contact with the second reference region and a second terminal in electrical communication with the input or output signals of the electronic component.

15. The electronic module assembly of claim 12 wherein the low pass filter component has a time response from about 0.01 milliseconds to about 10 milliseconds when the first electromagnetic noise signal has a frequency from about 0.1 to about 100 KHz.

16. The electronic module assembly of claim 12 wherein the low pass filter component has a time response from about 0.01 microseconds to about 10 microseconds when the first electromagnetic noise signal has a frequency from about 0.1 MHz to about 100 MHz.

17. The electronic module assembly of claim 12 wherein the magnitude of the impedance of the impedance component is from about 5 ohms to about 50 ohms.

18. A method of reducing noise on input and output signals to an electronic module which resides on a first electric reference region characterized with a first electromagnetic noise signal, the method comprising:
reducing the electromagnetic noise by positioning an impedance component in series with the first electric reference region and a second electric reference region, the second electric reference region being characterized by a second electromagnetic noise signal that is less than the first electromagnetic noise signal because of attenuation of the first electromagnetic noise signal by the impedance component; and
filtered one or both of an output signal and an input signal to the electronic module with a low pass filter component referenced to the second electric reference region.

19. The method of claim 18 wherein the low pass filter component is an active or passive low pass filter.

20. The method of claim 18 wherein the low pass filter component is a shunt capacitor with a first terminal in electrical contact with the second reference region and a second terminal in electrical communication with the input or output signals of the electronic component.

21. The method of claim 18 wherein the low pass filter component has a time response from about 0.01 milliseconds to about 10 milliseconds when the first electromagnetic noise signal has a frequency from about 0.1 to about 100 KHz.

22. The method of claim 18 wherein the low pass filter component has a time response from about 0.01 microseconds to about 10 microseconds when the first electromagnetic noise signal has a frequency from about 0.1 MHz to about 100 MHz.

23. The method of claim 18 wherein the magnitude of the impedance of the impedance component is from about 5 ohms to about 50 ohms.

* * * * *